(12) United States Patent
Hsu et al.

(10) Patent No.: US 12,188,974 B2
(45) Date of Patent: Jan. 7, 2025

(54) METHOD FOR TESTING LIGHT-EMITTING DEVICES

(71) Applicant: EPISTAR CORPORATION, Hsinchu (TW)

(72) Inventors: Sheng Jie Hsu, Hsinchu (TW); Chia Hui Lin, Hsinchu (TW); Po Chun Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 97 days.

(21) Appl. No.: 17/717,770

(22) Filed: Apr. 11, 2022

(65) Prior Publication Data

US 2022/0326297 A1 Oct. 13, 2022

(30) Foreign Application Priority Data

Apr. 12, 2021 (TW) .................................. 110113127

(51) Int. Cl.
*G01R 31/26* (2020.01)
*G01R 1/073* (2006.01)

(52) U.S. Cl.
CPC ..... *G01R 31/2635* (2013.01); *G01R 1/07307* (2013.01)

(58) Field of Classification Search
CPC .... G01R 31/26; G01R 31/2635; G01R 1/073; G01R 1/07307; G01R 31/44; G01R 31/2831; G01R 31/2865; G01R 31/318511; G01J 3/502; G01J 3/513; G09G 3/006
See application file for complete search history.

(56) References Cited

U.S. PATENT DOCUMENTS

| 2011/0267087 A1* | 11/2011 | Huang | G09G 3/006 324/762.01 |
| 2013/0001405 A1* | 1/2013 | Walker | G01J 1/0411 250/208.2 |
| 2018/0358339 A1* | 12/2018 | Iguchi | G09G 3/3233 |

FOREIGN PATENT DOCUMENTS

| CN | 112385027 A | 2/2021 | |
| EP | 3803958 B1 * | 9/2023 | ............... G01J 3/50 |

* cited by examiner

*Primary Examiner* — Son T Le
(74) *Attorney, Agent, or Firm* — DITTHAVONG, STEINER & MLOTKOWSKI

(57) ABSTRACT

A method for testing LEDs includes: Step 1: providing a wafer including a plurality of LEDs and selecting N LEDs from the plurality of LEDs to form an LED group; Step 2: selecting n LEDs from the LED group, where 1<n<N, and testing the n LEDs at a time to obtain a subgroup optical parameter of the LED group; Step 3: performing the Step 2 on the N LEDs repeatedly and alternately for another n LEDs in the LED group to obtain a plurality of the subgroup optical parameters; and Step 4: obtaining an optical parameter of each of the LEDs in the LED group from the plurality of the subgroup optical parameters.

17 Claims, 9 Drawing Sheets

METHOD FOR TESTING LIGHT-EMITTING DEVICES

CROSS-REFERENCE TO RELATED APPLICATIONS

This application claims priority to the benefit of Taiwan Patent Application Number 110113127 filed on Apr. 12, 2021, and the entire contents of which are hereby incorporated by reference herein in its entirety.

BACKGROUND

Technical Field

The present application relates to a method for testing light-emitting devices, more specifically, to a method for testing light-emitting devices by using a plurality of probe sets.

Description of the Related Art

The light-emitting diodes (LEDs) of solid-state lighting device have the characteristics of low power consumption, low heat-generation, long lifetime, compact size, high response speed. Thus, the LEDs have been widely using in household appliance, lighting device, indicating lamp, optical device and the like. As the optical technique develops, solid-state lighting devices have great improvements in light-emitting efficiency, lifetime, and brightness.

A conventional LED includes a substrate, an n-type semiconductor layer, an active region, a p-type semiconductor layer formed on the substrate, and p-electrode and n-electrode respectively formed on the p-type and n-type semiconductor layers. By applying a certain forward voltage on the LED via the electrodes, holes from the p-type semiconductor layer and electrons from the n-type semiconductor layer are combined in the active region so as to emit light. In general, the LEDs need to be tested to identify whether photoelectrical characteristics thereof meet the specification. However, as the LEDs are applied in various applications and the sizes of which become small, how to test the LEDs accurately and effectively concerns people in the present technology field.

SUMMARY

A method for testing LEDs is disclosed. The method includes: Step 1: providing a wafer including a plurality of LEDs and selecting N LEDs from the plurality of LEDs to form an LED group; Step 2: selecting n LEDs from the LED group, where 1<n<N, and testing the n LEDs at a time to obtain a subgroup optical parameter of the LED group; Step 3: performing the Step 2 on the N LEDs repeatedly and alternately for another n LEDs in the LED group to obtain a plurality of the subgroup optical parameters; and Step 4: obtaining an optical parameter of each of the LEDs in the LED group from the plurality of the subgroup optical parameters.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
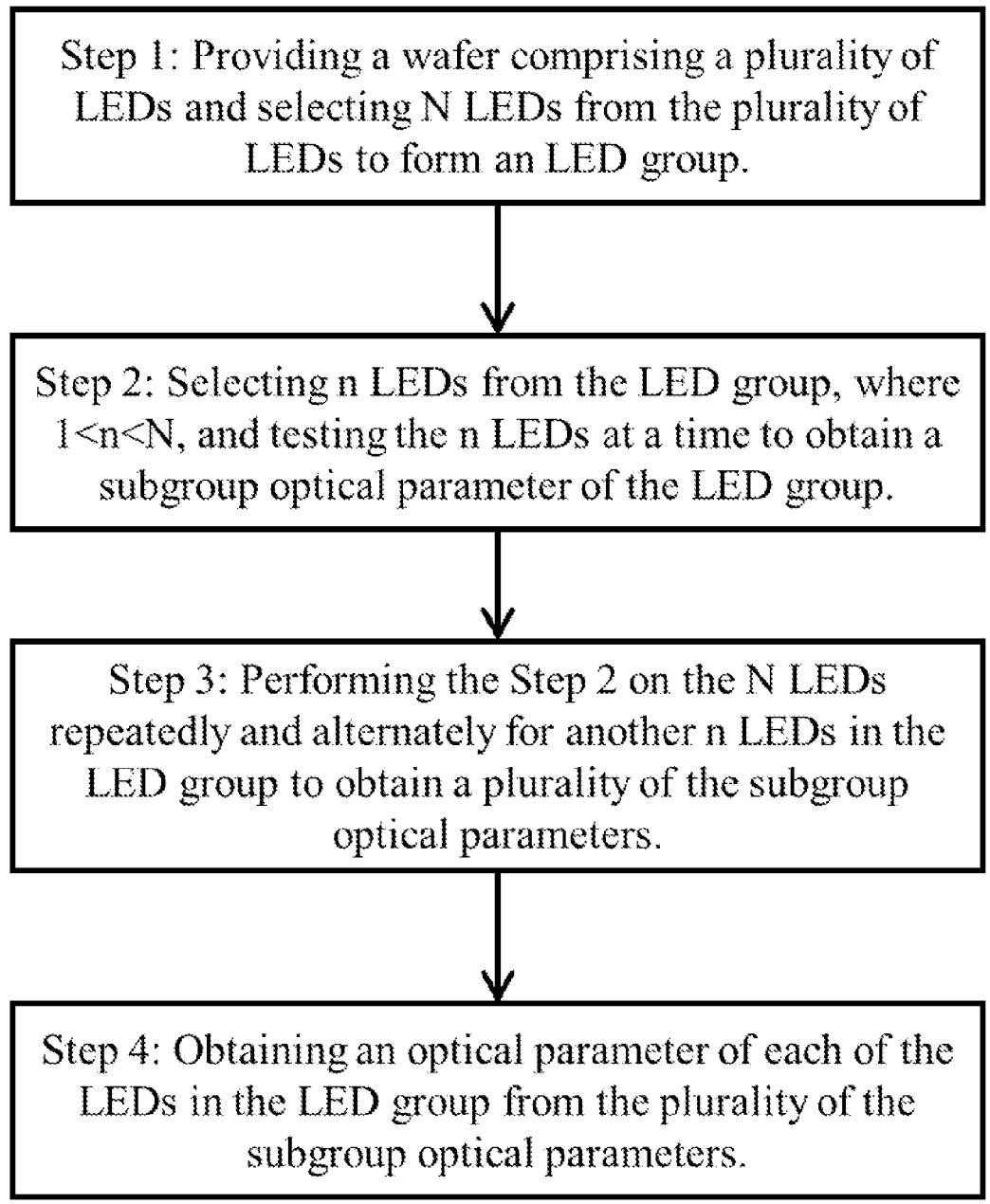
FIG. 1 shows a method for testing LEDs in accordance with an embodiment of the present application.
Figure 2A:
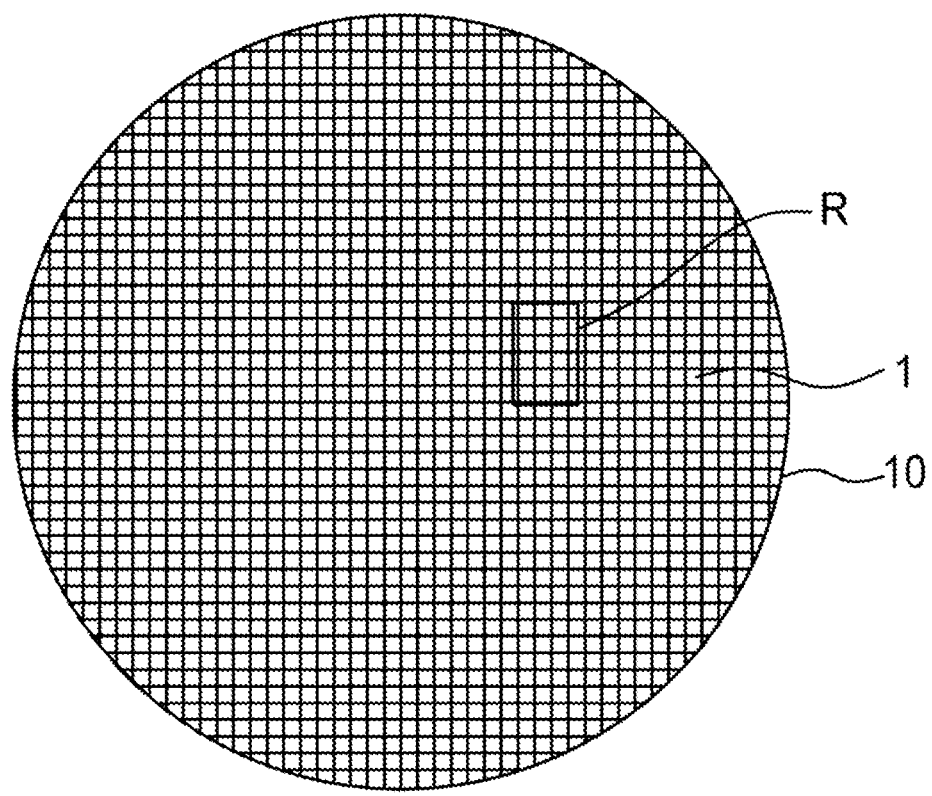
FIG. 2A shows a top view of a wafer.
Figure 2B:
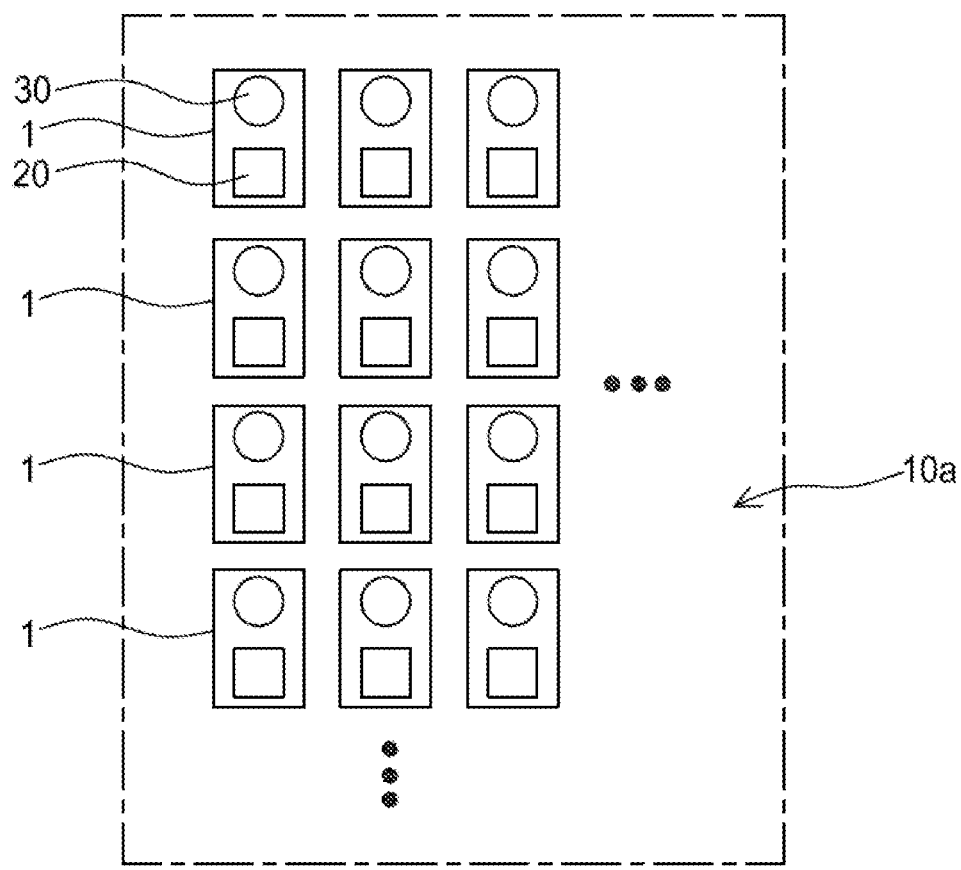
FIG. 2B shows a partial top view of a region R in FIG. 2A.

FIG. 1 show a method for testing LEDs in accordance with an embodiment of the present application. FIG. 2A shows a top view of a wafer and FIG. 2B shows a partial top view of a region R in FIG. 2A. FIGS. 3A-3D show partial top views of the region R in the method for testing LEDs in accordance with an embodiment.

Figure 3A:
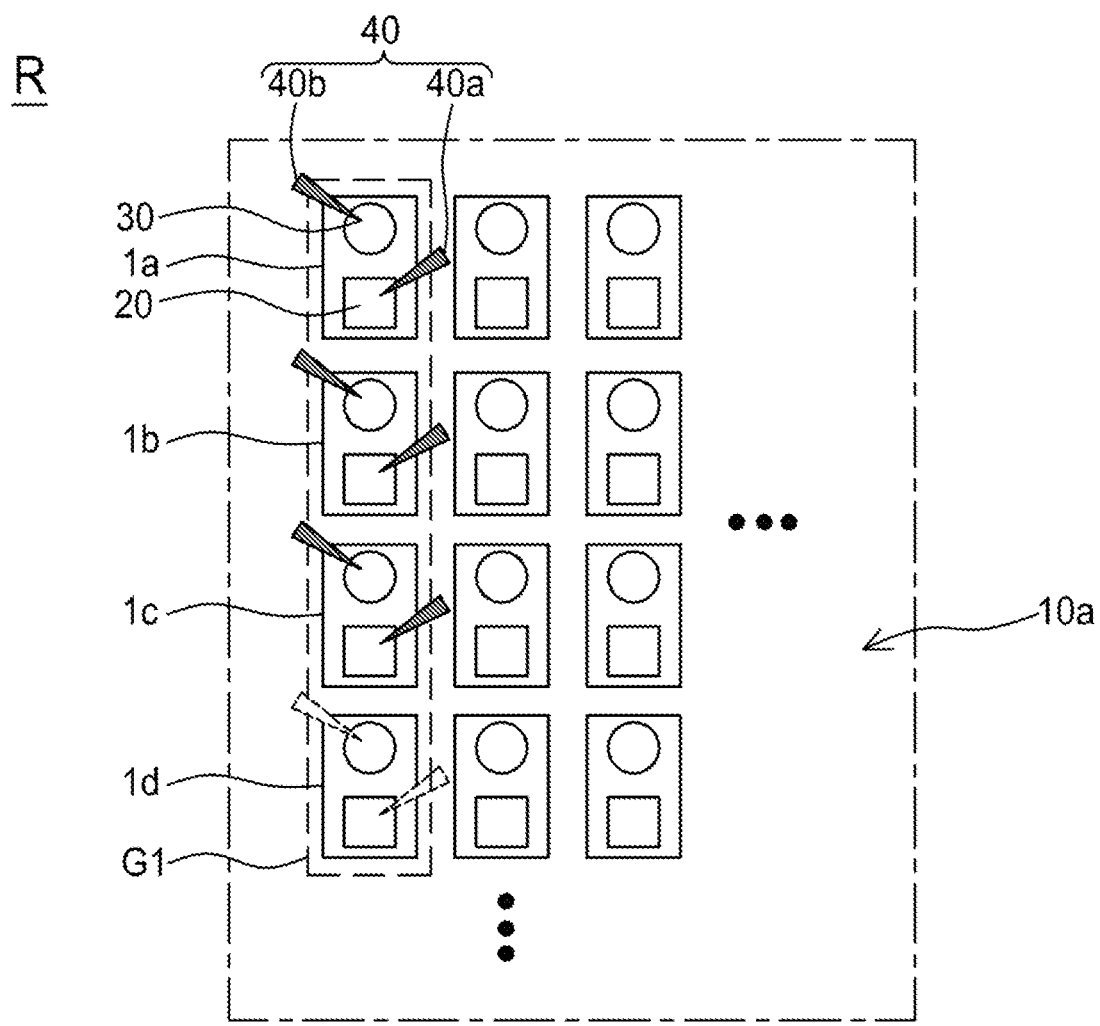
FIGS. 3A-3D show partial top views of the region R in the method for testing LEDs in accordance with an embodiment of the present application.

Referring to FIG. 1, FIG. 2A, FIG. 2B and FIG. 3A, in the method for testing LEDs in accordance with an embodiment of the present application, firstly a wafer 100 is provided. The wafer 100 includes a plurality of LEDs 1, and each of the LEDs 1 includes a substrate 10 and a semiconductor stack (not shown) formed on a first surface 10a of the substrate 1. N LEDs 1 among the plurality of LEDs 1 in the wafer 100 are selected and designated as an LED group. As shown in FIG. 3A, the LEDs 1a, 1b, 1c, and 1d are selected and designated as an LED group G1 for description in the following embodiments. In one embodiment, the plurality of LEDs 1 is disposed on the wafer 100 and formed in an array, and each of the LEDs 1 includes a first electrode 20 and a second electrode 30, which are respectively electrically connected to semiconductor layers (not shown) having different conductivity types. The structure of the LED 1 will be described in detail in the following paragraphs.

Then in Step 2 as shown in FIG. 1 and FIG. 3A, selecting n LEDs 1 from the N LEDs 1 in any one of the LED groups, where 1<n<N, and testing the n LEDs 1 at the same time to obtain a subgroup optical parameter of the LED group G1. In one embodiment, the n LEDs 1 are tested at the same time with n probe sets, and each probe set is connected to a measuring system. For example, as shown in FIG. 3A, n LEDs 1 are selected from the LED group G1 of the four LEDs 1a, 1b, 1c, and 1d, and four probe sets 40 are applied to contact the LEDs 1a, 1b, 1c, and 1d, respectively. Each of the probe sets 40 includes a first probe 40a contacting the first electrode 20 of the LED 1 and a second probe 40b contacting the second electrode 30 of the LED 1. In one embodiment, in the step of simultaneously testing the n LEDs, testing voltage or testing current is input to the n probe sets 40 among the four probe sets 40 to turn on the n respective LEDs 1 and the n LEDs are simultaneously tested with the n probe sets 40. For example, as shown in FIG. 3A, n is three. Only three of the probe sets 40 are used to input testing voltage or testing current into the three corresponding LEDs 1a, 1b and 1c so that the three LEDs 1a, 1b and 1c can be tested simultaneously. The probe set 40 contacts the LEDs 1d without conducting testing voltage or testing current. In the drawings of the present application, the probe set 40 in which no testing voltage or no testing current provided are represented by a dash-lined contour. The total optical parameters of the three LEDs 1a, 1b, and 1c form the first subgroup optical parameter and can be obtained by the testing system. The optical parameter can be the brightness, the spectrum or the emission wavelength of the LED. The first subgroup optical parameter can be the sum of the brightness of the three LEDs 1a, 1b, and 1c, the superimposed spectrum of the light emitted from the three LEDs 1a, 1b, and 1c, or the superimposed emission wavelength of the three LEDs 1a, 1b, and 1c.

Figure 3B:
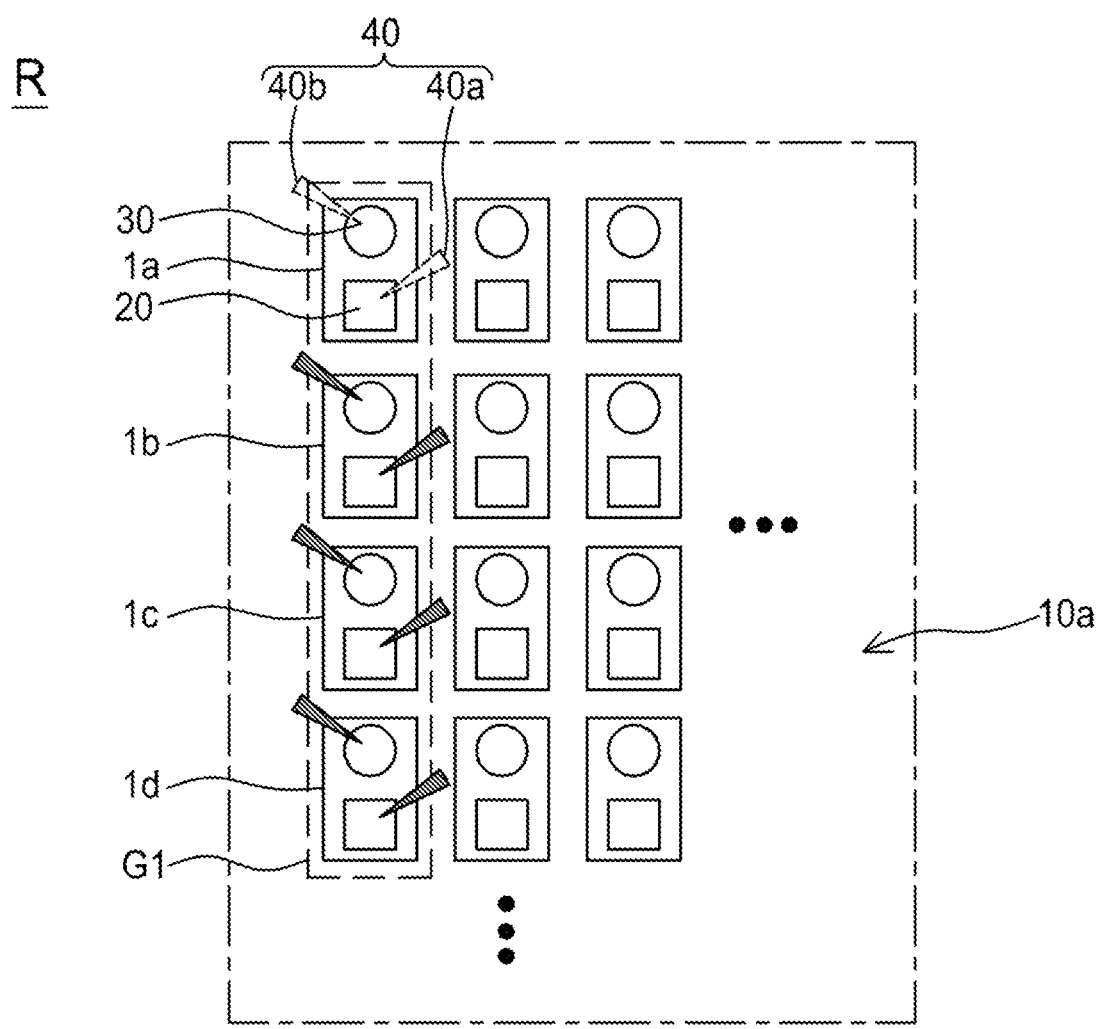
Figure 3C:
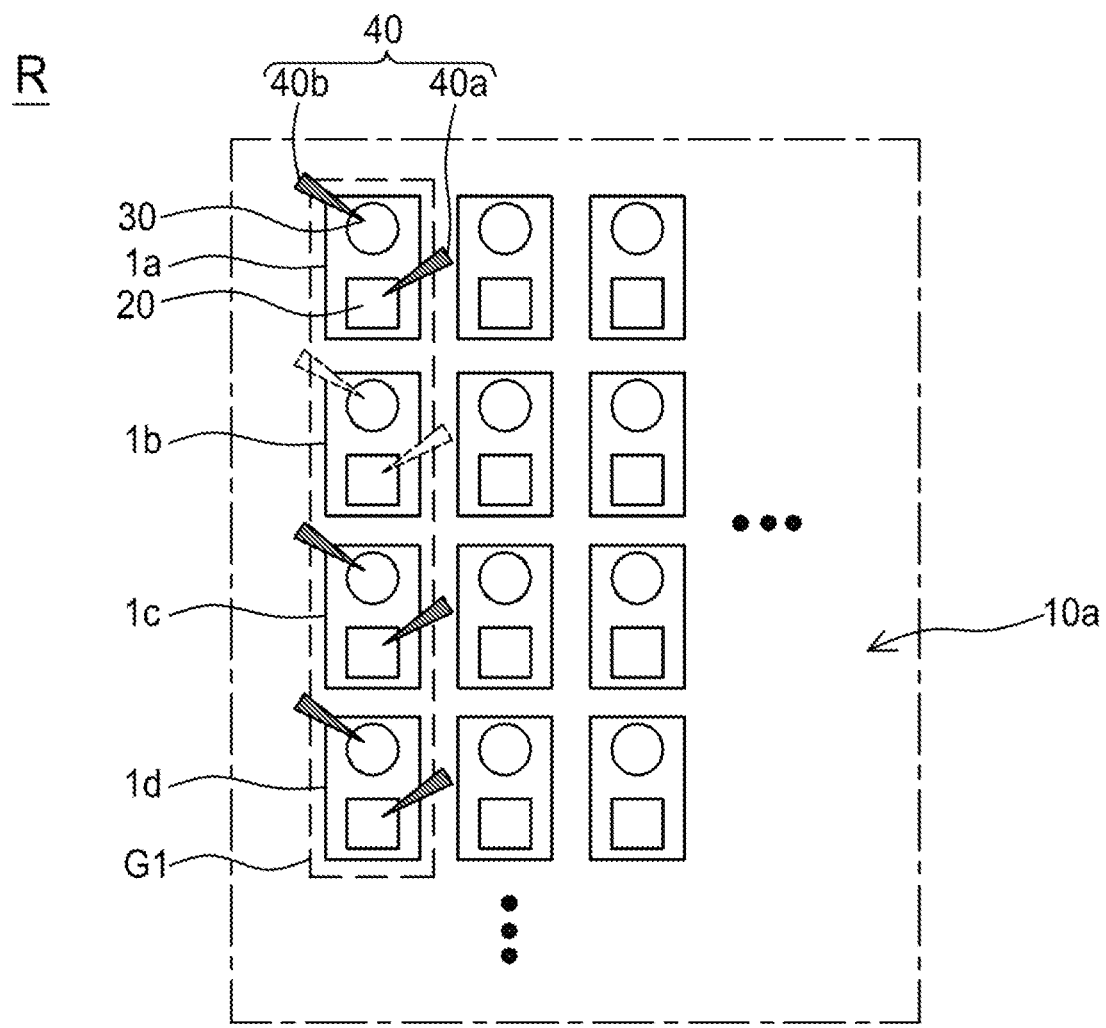
Figure 3D:
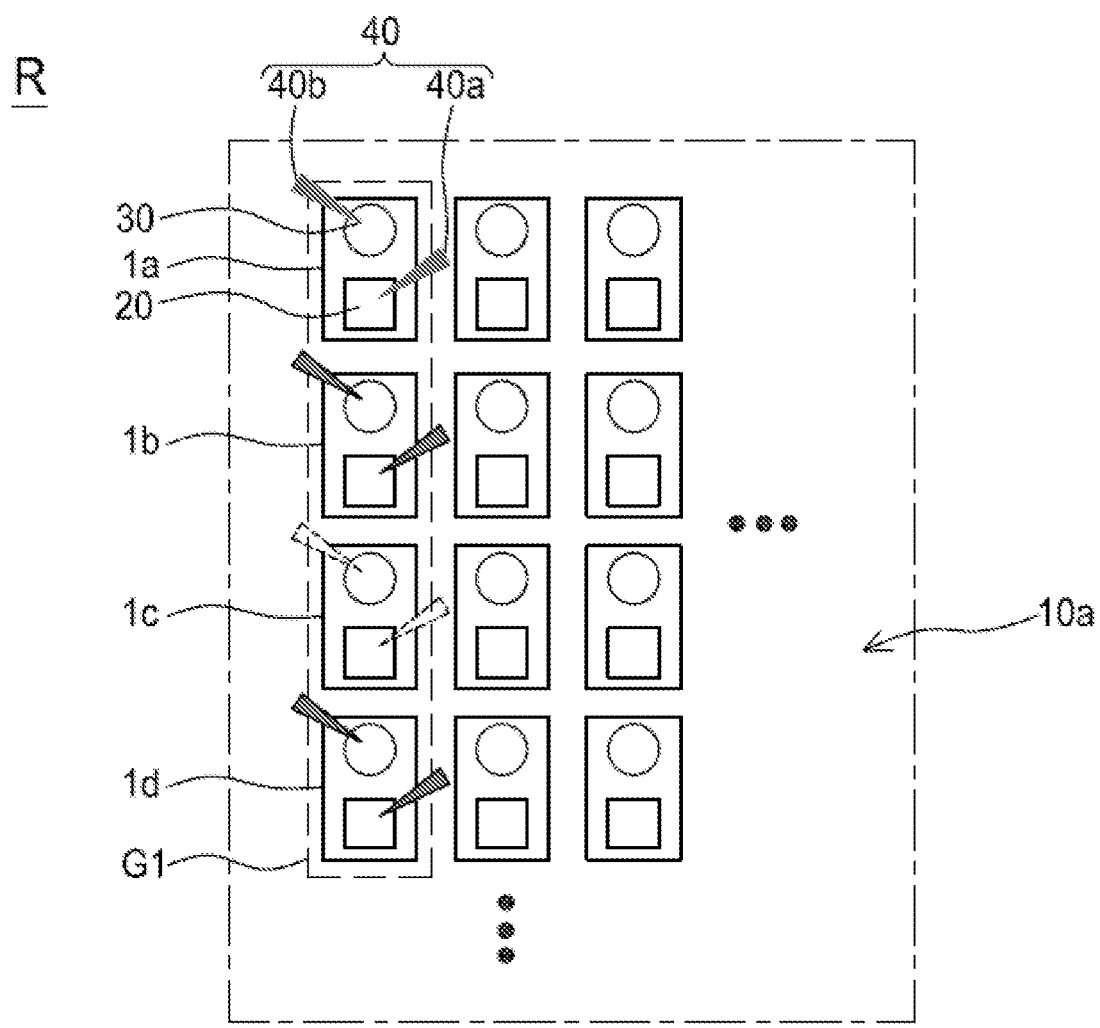

Next, as shown in Step 3 in FIG. 1, the Step 2 is repeatedly and alternately performed on the N LEDs in the LED group G1 and a plurality of subgroup optical parameters can be obtained. Performing Step 2 repeatedly and alternately is described in detail below. Referring to FIG. 3B, after obtaining the first subgroup optical parameters of the three LEDs 1a, 1b, and 1c, testing voltage or testing current is input to three probe sets 40 among the four probe sets 40 to turn on the three corresponding LEDs 1b, 1c and 1d. The three LEDs 1b, 1c and 1d are simultaneously tested. The probe set 40 contacts the LEDs 1a without conducting testing voltage or testing current. By the same way, a second subgroup optical parameter can be obtained. The second subgroup optical parameter can be the sum of the brightness of the three LEDs 1b, 1c and 1d, the superimposed spectrum of the three LEDs 1b, 1c and 1d, or the superimposed emission wavelength of the three LEDs 1b, 1c and 1d. Next, referring to FIG. 3C, testing voltage or testing current is input to three probe sets 40 among the four probe sets 40 to turn on the three corresponding LEDs 1a, 1c and 1d. The three LEDs 1a, 1c and 1d are simultaneously tested. The probe set 40 contacts the LEDs 1b without conducting testing voltage or testing current. By the same way, a third subgroup optical parameter can be obtained. The third subgroup optical parameter can be the sum of the brightness of the three LEDs 1a, 1c and 1d, the superimposed spectrum of the three LEDs 1a, 1c and 1d, or the superimposed emission wavelength of the three LEDs 1a, 1c and 1d. Next, referring to FIG. 3D, testing voltage or testing current is input to three probe sets 40 among the four probe sets 40 to turn on the three corresponding LEDs 1a, 1b and 1d. The three LEDs 1a, 1b and 1d are simultaneously tested. The probe set 40 contacts the LEDs 1c without conducting testing voltage or testing current. By the same way, a fourth subgroup optical parameter can be obtained. The fourth subgroup optical parameter can be the sum of the brightness of the three LEDs 1a, 1b and 1d, the superimposed spectrum of the three LEDs 1a, 1b and 1d, or the superimposed emission wavelength of the three LEDs 1a, 1b and 1d.

In the present embodiment, four LEDs are selected and designated as the LED group G1, and three LEDs in the LED group G1 are tested at the same time. Until all combinations of any three LEDs in the LED group G1 have been tested and four subgroup optical parameters are obtained, the testing can be performed on another LED group. In one embodiment, the number of LEDs 1 in the LED group may or may not be equal to the number of LEDs 1 in another LED group in different rounds of testing. In the present application, N and n can be set according to the design of the testing system and the user's requirement.

In another embodiment, in the step of simultaneously testing the n LEDs 1, the n LEDs 1 contact n probe sets 40 respectively at the same time and (N−n) LEDs 1 are not in contact with the probes 40.

Next, referring to Step 4 in FIG. 1, the individual optical parameters of each LEDs in the LED group are obtained from the plurality of subgroup optical parameters. In one embodiment, the individual optical parameter of each LED is firstly regarded as an unknown optical parameter, so the N LEDs have N unknown optical parameters. The N unknown optical parameters and the plurality of subgroup optical parameters obtained in Step 3 compose a plurality of equations, and then the plurality of equations is used to calculate the N unknown optical parameters, that is, the N individual optical parameters. For example, as shown in FIGS. 3A-3D, four subgroup optical parameters are obtained when completing Step 3. In one embodiment, the optical parameter is the brightness of the LED 1. For a simple explanation, the four subgroup optical parameters are represented as the sum of brightness P1, the sum of brightness P2, the sum of brightness P3 and the sum of brightness P4, and the brightness of individual LEDs 1a to 1d are represented as unknown optical parameters x1 to x4, respectively. The equations composed of P1-P4 and x1-x4 are as follows:

$$x1+x2+x3=P1$$

$$x2+x3+x4=P2$$

$$x1+x3+x4=P3$$

$$x1+x2+x4=P4$$

The four unknown optical parameters x1 to x4, i.e. the brightness of individual LEDs, can be determined by solving the equations.

In another embodiment, the optical parameter is the spectrum of light emitted from the LED 1. For a simple explanation, the four subgroup optical parameters are represented as spectrums $W1(\lambda i)$ to $W4(\lambda i)$, and the spectrum of light emitted from individual LEDs 1a to 1d are represented as unknown optical parameters $s1(\lambda i)$ to $s4(\lambda i)$, respectively, wherein $\lambda i$ is wavelength. The equations composed of $W1(\lambda i)$ to $W4(\lambda i)$ and $s1(\lambda i)$ to $s4(\lambda i)$ are as follows:

$$s1(\lambda_i)+s2(\lambda_i)+s3(\lambda_i)=W1(\lambda_i)$$

$$s2(\lambda_i)+s3(\lambda_i)+s4(\lambda_i)=W2(\lambda_i)$$

$$s1(\lambda_i)+s3(\lambda_i)+s4(\lambda_i)=W3(\lambda_i)$$

$$s1(\lambda_i)+s2(\lambda_i)+s4(\lambda_i)=W4(\lambda_i)$$

The four unknown optical parameters $s1(\lambda i)$ to $s4(\lambda i)$, i.e. the spectrum of individual LEDs, can be determined by solving the equations.

In a conventional testing method, the optical parameters of each LEDs are directly measured by a probe set contacting a single LED. When the size of the LED becomes small, the number of the LEDs in a unit area of the wafer increases, and much more time is needed for testing the LEDs by conventional testing method. In addition, due to the reduction of the LED size, the brightness of single LED is also reduced so it is more difficult for the testing system to collect the light sufficient for testing. In other words, it needs more time to accurately measure the brightness and the wavelength of a single LED. However, in the embodiment of the present application, even if the size of the LED is small and the brightness of a single LED is reduced, a plurality of LEDs in an LED group is turned on and tested at the same time to obtain the plurality of subgroup optical parameters. Then, the plurality of subgroup optical parameters is calculated and processed to obtain the optical parameters of individual LED, thereby shortening the light-collecting time and testing time and improving the efficiency of testing.

As shown in FIG. 3A to FIG. 3D, the N LEDs are continuously arranged in the same row or the same column. In another embodiment, the N LEDs can be arranged in a two-dimensional array, for example, four LEDs are arranged in a 2×2 array. In another embodiment, the N LEDs are discontinuously arranged in the same row, in the same column, or arranged in an array. Here, the N LEDs are discontinuously arranged because there could be one or more other LEDs disposed between the pre-defined N LEDs.

Figure 4:
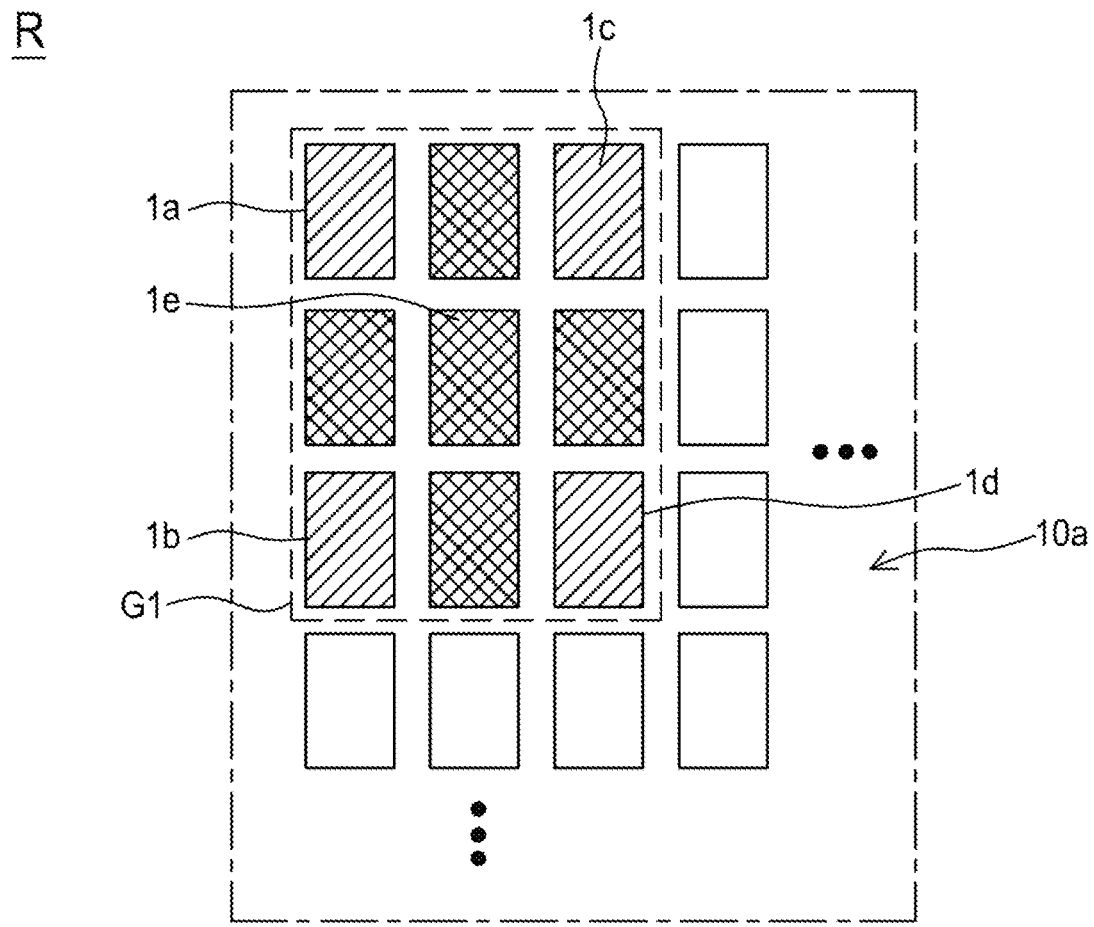
FIG. 4 shows a partial top view of the region R in the method for testing LED chips in accordance with another embodiment of the present application.

In another embodiment shown in FIG. 4, N LEDs 1 (1a, 1b, 1c, 1d) are selected and designated as a LED group G1, and the LEDs 1 (1a, 1b, 1c and 1d) are discontinuously arranged with LEDs 1e interposed therebetween. Before performing the testing, it can be determined whether there is any failed LED in the wafer 100 by means such as image, and then the testing is performed. For example, if any one of the LEDs 1e between the LEDs 1a, 1b, 1c, and 1d is defined as a fail LED, the LED 1e is not tested in the testing.

In another embodiment, referring to FIG. 4 as well, N LEDs 1 (1a, 1b, 1c, 1d) are selected and designated as a LED group G1, and the LEDs 1 (1a, 1b, 1c, 1d) are discontinuously arranged with the LEDs 1e interposed therebetween. After Steps 1 to 4 of the testing method are completed, optical parameters of each LED 1 (1a, 1b, 1c, 1d) can be obtained. Assuming that the photoelectric characteristics of adjacent LEDs on the wafer are approximately the same, the average of the optical parameters of the LEDs 1a, 1b, 1c and 1d can also be regarded as the optical parameter of the LED 1e. Alternatively, the optical parameters of the LEDs 1a, 1b, 1c and 1d may be regarded as the optical parameters of the adjacent LED 1e. In such case, there is no need to test the LEDs 1e so that testing time can be saved. FIG. 4 is an example of four LEDs 1a-1d that are discontinuously arranged in an array. However, the present embodiment is not limited to this. The testing method in accordance with the present embodiment can be applied to a plurality of LEDs that is discontinuously arranged in the same row or the same column.

The detailed structure of the LED 1 is described in the following.

Figure 5:
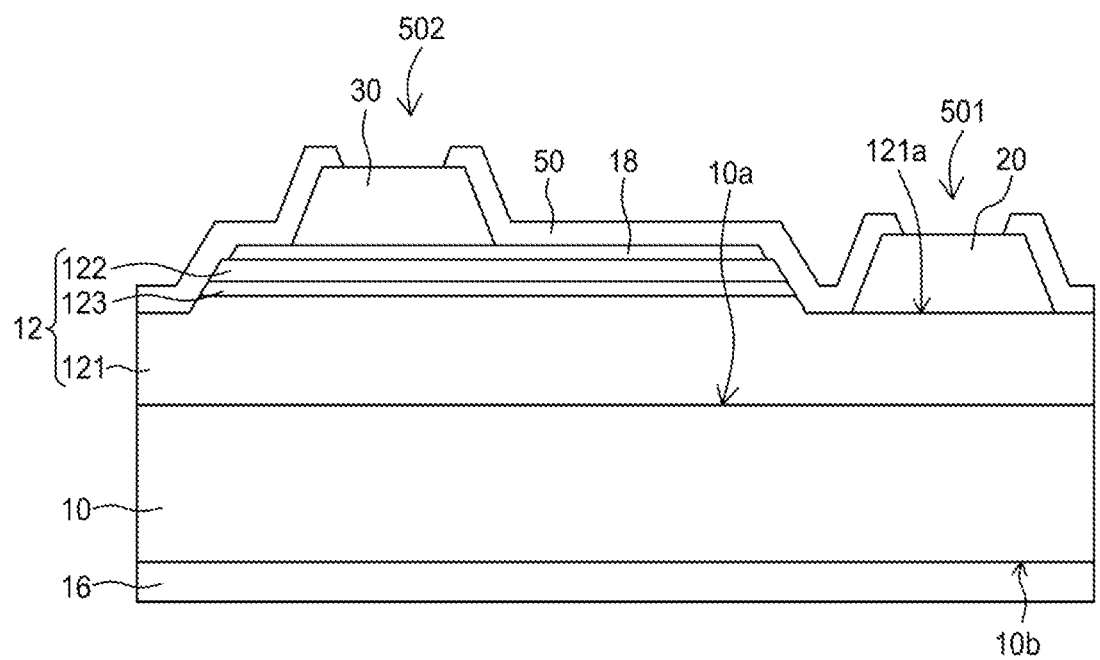
FIG. 5 shows an LED in accordance with an embodiment of the present application.

FIG. 5 shows a cross-sectional view of the LED 1 in accordance with an embodiment of the present application. As shown in FIG. 5, the LED 1 includes a substrate 10 and a semiconductor stack 12 formed on the first surface 10a of the substrate 10, and wherein the semiconductor stack 12 includes a first semiconductor layer 121, an active region 123 and a second semiconductor layer 122 sequentially on the first surface 10a. The first semiconductor layer 121 includes a first surface 121a not covered by the active region 123 and the second semiconductor layer 122. A transparent conductive layer 18 is formed on the second semiconductor layer 122. The first electrode 20 is formed on the first surface 121a of the first semiconductor layer 121 and the second electrode 30 is formed on the transparent conductive layer 18. A protective layer 50 is formed on the semiconductor stack 12. A reflective structure 16 can be selectively formed on a second surface 10b of the substrate 10 opposite to the first surface 10a.

The substrate 10 can be a growth substrate, including a GaP substrate or a GaAs substrate for growing AlGaInP thereon, or a sapphire substrate, an MN substrate, a GaN substrate or a SiC substrate for growing InGaN or AlGaN thereon. In one embodiment, the substrate 10 includes a patterned substrate, that is, the substrate 10 includes a patterned structure (not shown) on the first surface 10a. In an embodiment, the light emitted from the semiconductor stack 12 can be refracted by the patterned structure of the substrate 10, thereby improving the brightness of the LED. In addition, the patterned structure lessens or suppresses the dislocation caused by lattice mismatch between the substrate 10 and the semiconductor stack 12, thereby improving the epitaxy quality of the semiconductor stack 12. In another embodiment, the substrate 10 can be a temporary substrate. The semiconductor stack 12 is formed on a growth substrate by, for example, epitaxial growth, and then is attached to the substrate 10 by an adhesive layer thereby the growth substrate can be removed. In another embodiment, the substrate 10 may be a permanent substrate. The semiconductor stack 12 is formed on a growth substrate by, for example, epitaxial growth, and then is attached to a temporary substrate. After removing the growth substrate, the semiconductor stack 12 is transferred to the permanent substrate from the temporary substrate and then the temporary substrate is removed. The semiconductor stack 12 is attached to the substrate 10 by an adhesive layer. The adhesive layer is transparent to the light emitted by the semiconductor stack 12. The material of the adhesive layer can be an insulating material and/or a conductive material. The insulating material includes polymer, glass, spin-on-glass (SOG), or dielectric materials such as aluminum oxide, silicon oxide, titanium oxide, tantalum oxide, silicon nitride. The conductive material includes metal oxides such as indium tin oxide (ITO), diamond-like carbon (DLC) and the like. The substrate 10 used for temporary substrate or permanent substrate is transparent to the light generated by semiconductor stack 12, and its materials include conductive materials, composite materials, metal matrix composites (MMC), ceramic matrix composites (CMC), polymer based composite material or insulating material. The insulating material includes sapphire, diamond, glass, polymer, epoxy, quartz, acrylic, etc.

In one embodiment, after the testing of the plurality of LEDs 1 in the wafer 100 is completed, the substrate 10 is then split into the plurality of individual LEDs 1. In another embodiment, the substrate 10 can be split first to obtain then plurality of individual LEDs 1, and then the test can be performed. After the step of splitting the substrate 10, the plurality of LEDs 1 is still arranged in an array and fixed to a carrier such as a blue tape. In this case, the plurality of individual LEDs 1 is still defined as constituting the wafer 100.

In an embodiment of the present application, the semiconductor stack 12 is formed on the substrate 10 by metal organic chemical vapor deposition (MOCVD), molecular beam epitaxy (MBE), hydride vapor epitaxy (HVPE) or ion plating such as sputtering or evaporating.

The semiconductor stack 12 can further include a buffer structure (not shown) between the first surface 10a of the substrate 10 and the first semiconductor layer 121. The buffer structure, the first semiconductor layer 121, the active region 123, and the second semiconductor layer 122 compose the semiconductor stack 12. The buffer structure reduces the lattice mismatch and suppresses dislocation so as to improve the epitaxy quality. The material of the buffer structure includes GaN, AlGaN, or AlN. In an embodiment, the buffer structure includes a plurality of sub-layers (not shown) having the same material or different materials. In an embodiment, the first semiconductor layer 121 and the second semiconductor layer 122 are, for example, cladding layer or confinement layer. The first semiconductor layer 121 and the second semiconductor layer 122 have different conductivity types, different electrical properties, different polarities or different dopants for providing electrons or holes. For example, the first semiconductor layer 121 is an n-type semiconductor and the second semiconductor layer 122 is a p-type semiconductor. The active region 123 is formed between the first semiconductor layer 121 and the second semiconductor layer 122. Driven by a current, electrons and holes are combined in the active region 123 to convert electrical energy into optical energy for illumination. The wavelength of the light generated by the semiconductor stack 12 can be adjusted by changing the physical properties and chemical composition of one or more layers in the semiconductor stack 12.

The material of the semiconductor stack 12 includes III-V semiconductor with $Al_xIn_yGa_{(1-x-y)}N$ or $Al_xIn_yGa_{(1-x-y)}P$, where $0 \leq x, y \leq 1$; $x+y \leq 1$. When the material of the active region of the semiconductor stack 12 includes AlInGaP, the semiconductor stack 12 emits red light having a wavelength between 610 nm and 650 nm or yellow light having a wavelength between 550 nm and 570 nm. When the material of the active region of the semiconductor stack 12 includes InGaN, the semiconductor stack 12 emits blue light or deep blue light having a wavelength between 400 nm and 490 nm or green light having a wavelength between 490 nm and 550 nm. The active region 123 can be a single hetero-structure (SH), a double hetero-structure (DH), a double-side double hetero-structure (DDH), or a multi-quantum well (MQW). The material of the active region 123 can be i-type, p-type or n-type.

The transparent conductive layer 18 electrically connects the second semiconductor layer 122 for laterally spreading current. In one embodiment, the transparent conductive layer 18 includes an opening (not shown) below the second electrode 30 and exposing the second semiconductor layer 122. The transparent conductive layer 18 can be metal or transparent conductive material. The metal material can be selected form a thin metal layer having light transparency. The transparent conductive material is transparent to the light emitted by the active region 123, such as graphene, indium tin oxide (ITO), aluminum zinc oxide (AZO), gallium zinc oxide (GZO), zinc oxide (ZnO) or indium zinc oxide (IZO).

The first electrode 20 is located on the first surface 121a of the first semiconductor layer 121 and is electrically connected to the first semiconductor layer 121. The second electrode 30 is electrically connected to the second semiconductor layer 122. The first electrode 20 and the second electrode 30 respectively include a pad electrode. FIG. 5 shows the pad electrodes of the first electrode 20 and the second electrode 30. In another embodiment, the first electrode 20 and/or the second electrode 30 further include finger electrodes (not shown) extending from the pad electrodes. The pad electrodes of the first electrode 20 and the second electrode 30 are used for wire bonding or welding to electrically connect the LED 1 with an external power source or an external electronic element. The materials of the first electrode 20 and the second electrode 30 include metals, such as Cr, Ti, Au, Al, Cu, Ag, Sn, Ni, Rh, Pt, an alloy or a laminated stack composed of the above materials.

The protective layer 50 includes openings 501 and 502. In the present embodiment shown in FIG. 5, the protective layer 50 covers the semiconductor stack 12, the transparent conductive layer 18, a part of the first electrode 20 and a part of the second electrode 30. The first electrode 20 and the second electrode 30 are exposed through the openings 501 and 502, and more specifically, the pad electrodes of the first electrode 20 and the second electrode 30 are exposed.

Figure 6:
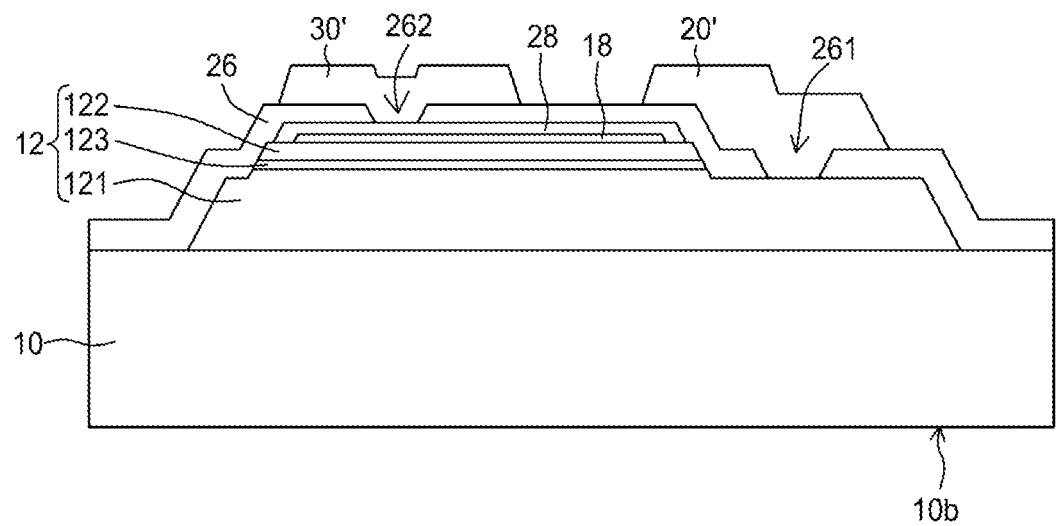
FIG. 6 shows an LED in accordance with another embodiment of the present application.

FIG. 6 shows a cross-sectional view of a LED 1' in accordance with another embodiment of the present application. Different from the embodiment shown in FIG. 5, the LED 1' is a flip-chip device, and the first electrode 20' and the second electrode 30' of the LED 1' are connected to a carrier (not shown) in a flip-chip manner. The LED 1' is connected with the circuit (not shown) on the carrier, so as to connect an external electronic component or external power source.

The LED 1' includes a reflective structure 28 covering the transparent conductive layer 18. The reflective structure 28 includes a metal reflective layer, such as a single metal layer or a laminated stack of a plurality of metals. In one embodiment, the reflective structure 28 includes a barrier layer (not shown) and a reflective layer (not shown). The barrier layer is formed on and covers the reflective layer. The barrier layer can prevent migration, diffusion or oxidation of the metal elements in the reflective layer. The material of the reflective layer includes a metal material having high reflectivity for the light emitted from the semiconductor stack 12, such as silver Ag, Au, Al, Ti, Cr, Cu, Ni, Pt, Ru, an alloy or a laminated stack composed of the above materials. The material of the barrier layer includes Cr, Pt, Ti, W, Zn, an alloy or a laminated stack of the above materials. The light emitted from the semiconductor stack 12 is extracted from the lower surface 10b of the substrate 10 through the reflection of the reflective structure 28, thereby increasing the brightness of the LED 1'.

The LED 1' includes a protective layer 26 covering the semiconductor stack 12 and sidewalls of the semiconductor stack 12. In one embodiment, the protective layer 26 can further cover the first surface 10a of the substrate 10. The protective layer 26 includes openings 261 and 262 exposing the first semiconductor layer 121 and the reflective structure 28, respectively. The material of the protective layer 26 is a non-conductive material, including organic materials such as Sub and benzocyclobutene (BCB), inorganic materials such as silicone or glass, or dielectric materials such silicon oxide (SiOx), silicon nitride (SiNx) and the like. In one embodiment, the protective layer 26 is formed by alternately stacking a pair or a plurality of pairs of materials with different refractive indices. By selecting the materials with different refractive indices and the thickness thereof, the protective layer 26 functions as a reflective structure that reflects light within a predefined wavelength range such as a distributed Bragg reflector. When the protective layer 26 forms a reflective structure, the light emitted by the semiconductor stack 12 is extracted from the lower surface 10b of the substrate 10 through the reflection of the protective layer 26, which increases the brightness of the LED 1'. The testing method for the LED 1' is similar to that for the LED 1 and the difference is that the light-collection system used for the LED 1' is placed on a lower side of the LEDs. That is, the plurality of LED 1' is placed on a transparent carrier (not shown) with electrodes facing upward, and the light-collection system is located under the transparent carrier to receive the lights of the sub-groups of LEDs to be tested and measures the optical parameters. In another embodiment, the plurality of LEDs 1' are attached to a plurality of pads of a testing circuit board by die bond. The substrates 10 of the plurality of LEDs are facing upward. The light-collection system of the testing system can be placed on the LEDs 1' as disclosed in the aforementioned embodiments that the light-extracting surface of the LEDs is facing upward, to testing the LEDs 1'. In accordance with the testing method disclosed in the present application, N LEDs 1' are designated as a LED group and n LEDs 1' are selected among the LED group. The testing voltage or the testing current is input to the n LEDs 1' via the plurality of pads of the testing circuit board to turn on the n LEDs 1', so as to test the n LEDs 1' at the same time.

In one embodiment, the reflective structure 28 can be omitted when the protective layer 26 is a reflective structure.

The LED 1' includes a first electrode 20' and a second electrode 30'. The first electrode 20' is electrically connected to the first semiconductor layer 121 through the opening 261 and the second electrode 30' is electrically connected to the reflective structure 28, the transparent conductive layer 18 and the second semiconductor layer 122 through the opening 262. The materials of the first electrode 20' and the second electrode 30' include metals, such as Cr, Ti, W, Au, Al, In, Sn, Ni, Rh, Pt, an alloy or a laminated stack composed of the above materials. The first electrode 20' and the second electrode 30' can be a single metal layer or a laminated stack of a plurality of metals.

In one embodiment, in a top view, the LED 1 (or 1') has a diagonal length in a range of 100 μm to 350 μm. In another embodiment, the diagonal length is between 100 μm to 300 μm. In one example, in the LED 1 (or 1'), the distance between the first electrode 20 and the second electrode 30 or the distance between the first electrode 20' and the second electrode 30' is less than 100 μm. In another embodiment, the distance is less than 60 μm.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method for testing LEDs, comprising:
   Step 1: providing a wafer comprising a plurality of LEDs and selecting N LEDs from the plurality of LEDs to form an LED group;
   Step 2: selecting n LEDs from the LED group, where 1<n<N, and testing the n LEDs at a time to obtain a subgroup optical parameter of the LED group;
   Step 3: performing the Step 2 on the N LEDs repeatedly and alternately for another n LEDs in the LED group to obtain a plurality of the subgroup optical parameters; and
   Step 4: obtaining an optical parameter of each of the LEDs in the LED group from the plurality of the subgroup optical parameters, wherein each of the subgroup optical parameters comprises a sum or a superimposition of optical parameters of the n LEDs which are selected and tested at the time.

2. The method according to claim 1, wherein the optical parameter comprises a brightness, an emission spectrum, or an emission wavelength of the LED.

3. The method according to claim 2, wherein the subgroup optical parameter comprises a sum of the brightness, a superimposed emission spectrum or a superimposed emission wavelength of the n LEDs which are selected and tested at the time.

4. The method according to claim 3, wherein the Step 4 comprises:
   setting the optical parameter of each of the LEDs as an unknown optical parameter, and the N LEDs comprises N unknown optical parameters;
   the N unknown optical parameters and the plurality of subgroup optical parameters composing a plurality of equations; and
   calculating the N unknown optical parameters from the plurality of equations.

5. The method according to claim 1, further comprising using probe sets to contact the N LEDs and wherein each of the N LEDs comprises a first electrode and a second electrode; and
   wherein the Step 2 comprises:
   using n probe sets to respectively contact the n LEDs at a time, wherein each of the n probe sets comprises a first probe and a second probe, and the first probe and the second probe of each of the n probe sets respectively contact the first electrodes and the second electrodes of each of the n LEDs;
   inputting voltage or current to the n probe sets; and
   testing the n LEDs to obtain the subgroup optical parameter.

6. The method according to claim 1, further comprising using probe sets to contact the N LEDs and wherein each of the N LEDs comprises a first electrode and a second electrode; and
   wherein the Step 2 comprises:
   using N probe sets to respectively contact the N LEDs at a time, wherein each of the N probe sets comprises a first probe and a second probe, and the first probe and the second probe of each of the N probe sets respectively contact the first electrode and the second electrode of each of the N LEDs;
   inputting voltage or current to the n probe sets among the N probe sets and not inputting the voltage or the current to the probe set among the N probe sets other than the n probe sets; and
   testing the n LEDs to obtain the subgroup optical parameter.

7. The method according to claim 1, wherein each of the N LEDs comprises a first electrode and a second electrode, and a distance between the first electrode and the second electrode is less than 100 μm.

8. The method according to claim 1, wherein each of the N LEDs comprises diagonal length in a range of 100 μm to 300 μm.

9. The method according to claim 1, wherein the plurality of LEDs is arranged in an array with a plurality of rows and a plurality of columns, and the N LEDs are arranged in the same row, in the same column or in a sub-array of the array.

10. The method according to claim 1, wherein the Step 3 comprises:
    performing the Step 2 on the N LEDs repeatedly and alternately until any other n LEDs in the LED group have been tested to obtain the plurality of the subgroup optical parameters.

11. The method according to claim 1, wherein each of the LEDs comprises a substrate and a semiconductor stack on the substrate.

12. The method according to claim 11, wherein the plurality of LEDs is fixed to a carrier.

13. The method according to claim 11, further comprising an adhesive layer between the substrate and the semiconductor stack.

14. The method according to claim 1, wherein the plurality of LEDs comprises a first LED other than the N LEDs and the N LEDs are discontinuously arranged in the wafer with the first LED disposed therebetween.

15. The method according to claim 14, wherein an average of the optical parameters of the N LEDs in the LED group is regarded as an optical parameter of the first LED.

16. The method according to claim 14, wherein the first LED is adjacent to one of the LEDs among the N LEDs, and the optical parameter of the one of the LEDs is regarded as an optical parameter of the first LED.

17. The method according to claim 1, further comprising selecting and designated other N LEDs in the plurality of LEDs as a different LED group; and
performing the Step 2 to the Step 4 on the different LED group.

* * * * *